United States Patent
Hassun et al.

(10) Patent No.: US 6,263,289 B1
(45) Date of Patent: Jul. 17, 2001

(54) METHOD OF ENHANCING THE DYNAMIC RANGE OF INTERMODULATION DISTORTION MEASUREMENTS

(75) Inventors: Roland Hassun, San Mateo; Nicholas J Kuhn, Santa Rosa, both of CA (US)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 09/219,657

(22) Filed: Dec. 23, 1998

(51) Int. Cl.[7] .............................. G01R 29/26; H04Q 7/20
(52) U.S. Cl. .......................... 702/69; 702/191; 455/423
(58) Field of Search ........................ 702/57, 58, 64–74, 702/79, 88, 89, 107, 117–120, 124, 182, 189–191, 61, 62, 75–78, 106, 194, 195; 324/620, 624, 602; 455/423, 63, 67.1, 303, 304

(56) References Cited

U.S. PATENT DOCUMENTS

| | | | |
|---|---|---|---|
| 3,032,712 | * 5/1962 | Hurvitz | 324/624 |
| 5,160,895 | * 11/1992 | Siddoway et al. | 330/151 |
| 5,239,683 | * 8/1993 | Usui | 455/63 |
| 5,818,240 | * 10/1998 | Cabot | 324/626 |
| 6,097,324 | * 8/2000 | Myer et al. | 341/118 |

* cited by examiner

*Primary Examiner*—Patrick Assouad
*Assistant Examiner*—Manuel L. Barbee

(57) ABSTRACT

Intermodulation distortion (IMD), especially in the form of adjacent-channel power ratio (ACPR), is an important specification for cellular base stations, especially for the power amplifier. Suppliers must demonstrate that they meet these specifications. The specifications for some of the newer communications formats, such as some forms of wideband CDMA and for multi-carrier base stations, dictate levels of ACP that seriously challenge the ability of test equipment to perform the measurement. Similar considerations apply to measuring other parameters that quantize intermodulation distortion effects, including multi-tone methods and noise power ratio. The present invention provides a technique for measuring ACP and other forms of IMD of amplifiers and other two-port devices. The technique, which uses standard equipment, enhances the normal dynamic range of measurement by at least 25 dB.

7 Claims, 6 Drawing Sheets

METHOD OF ENHANCING THE DYNAMIC RANGE OF INTERMODULATION DISTORTION MEASUREMENTS

BACKGROUND OF THE INVENTION

The present invention relates to a method of enhancing the dynamic range of intermodulation distortion measurements.

Intermodulation distortion (IMD), especially in the form of adjacent-channel power ratio (ACPR), is an important specification for cellular base stations, especially for the power amplifier. Suppliers must demonstrate that they meet these specifications.

The specifications for some of the newer communications formats, such as many forms of wideband CDMA and for multi-carrier base stations, dictate levels of ACP that seriously challenge the ability of test equipment to perform the measurement. Similar considerations apply to measuring other parameters that quantize intermodulation distortion effects, including multi-tone methods and noise power ratio.

The present invention provides a technique for measuring ACP and other forms of IMD of amplifiers and other two-port devices. The technique, which uses standard equipment, enhances the traditional dynamic range of measurement by at least 25 dB.

SUMMARY OF THE INVENTION

It is an object of the present invention to provide a method of enhancing the dynamic range of intermodulation distortion measurements.

In one preferred embodiment, the present invention provides a method of enhancing the dynamic range of intermodulation distortion measurements comprising the steps of:

applying a signal source over a first path to a device under test (DUT);

measuring with a measuring instrument through a power combiner the signal power out of the DUT to form a reference power, which sometimes includes and sometimes doe not include measuring any spectral power components of IMD such as adjacent-channel power introduced the DUT, the signal source and the measuring instrument;

applying a cancellation signal over a second path and the power combiner to the measuring instrument that substantially cancels the signal over the first path through level and phase conditioning components and the power combiner to remove substantially most of the main channel power introduced from the DUT and substantially most of spectral power components of IMD such as adjacent-channel power introduced by the signal source and amplified by the DUT, and;

measuring the DUT introduced spectral components of IMD (intermodulation distortion) such as adjacent-channel power to enhance the dynamic range measurement.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
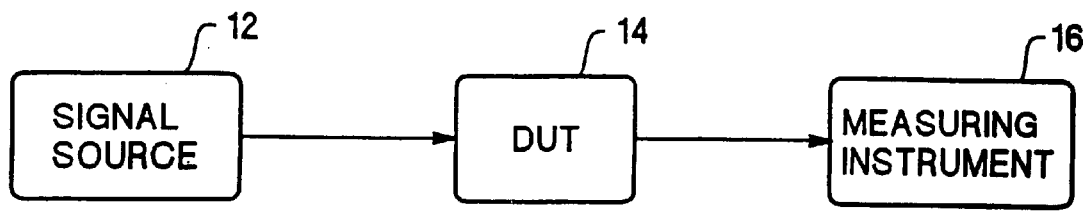
FIG. 1 shows a generic measurement setup for measuring ACPR or other forms of intermodulation distortion.

FIG. 1 shows a generic setup for performing the ACP measurement. A signal source 12 provides a signal with the characteristics of the specific modulation format to be tested, such as CDMA (IS95), W-CDMA, NADC, GSM, noise, etc. That signal drives the input of the device under test (DUT) 14. The output of the DUT 14 is applied to a measuring instrument 16, which is often a spectrum analyzer or other signal analyzer of the swept analog type. Recently, signal analyzers using sampling, digitizing and computation have become available for this type of measurement.

Figure 2:
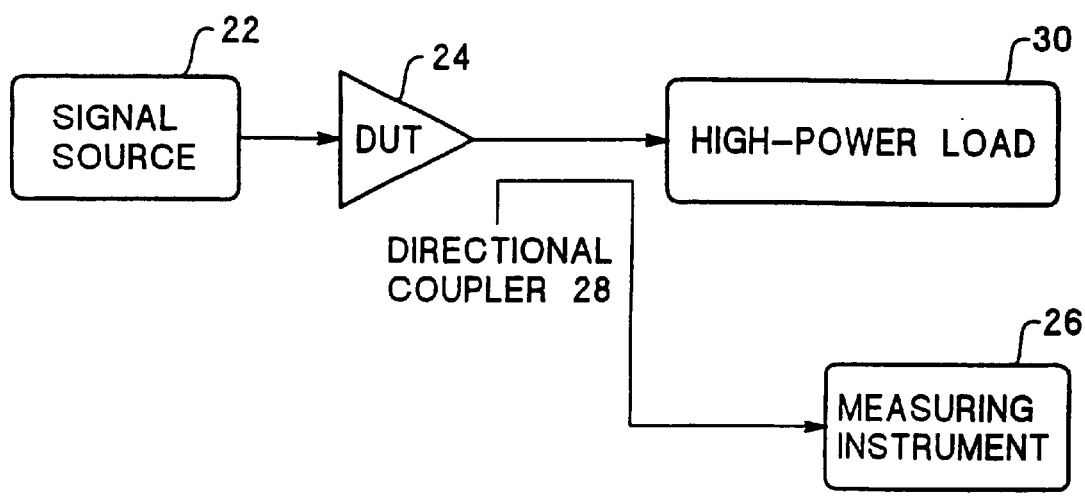
FIG. 2 shows a generic setup for measuring the ACPR of a high-power amplifier.

FIG. 2 shows a typical setup for measuring ACP of a base-station power amplifier. A signal source 22 provides a signal to DUT 24. The output of the DUT amplifier 24 is connected to a high-power load 30 and a portion of the output signal is coupled via directional coupler 28 to the measuring instrument 26. The coupled level to the measuring instrument 26 is commensurate with its power level limits. The coupling ratio is known with precision so that the absolute power at the output of the amplifier may be inferred precisely.

Figure 3:
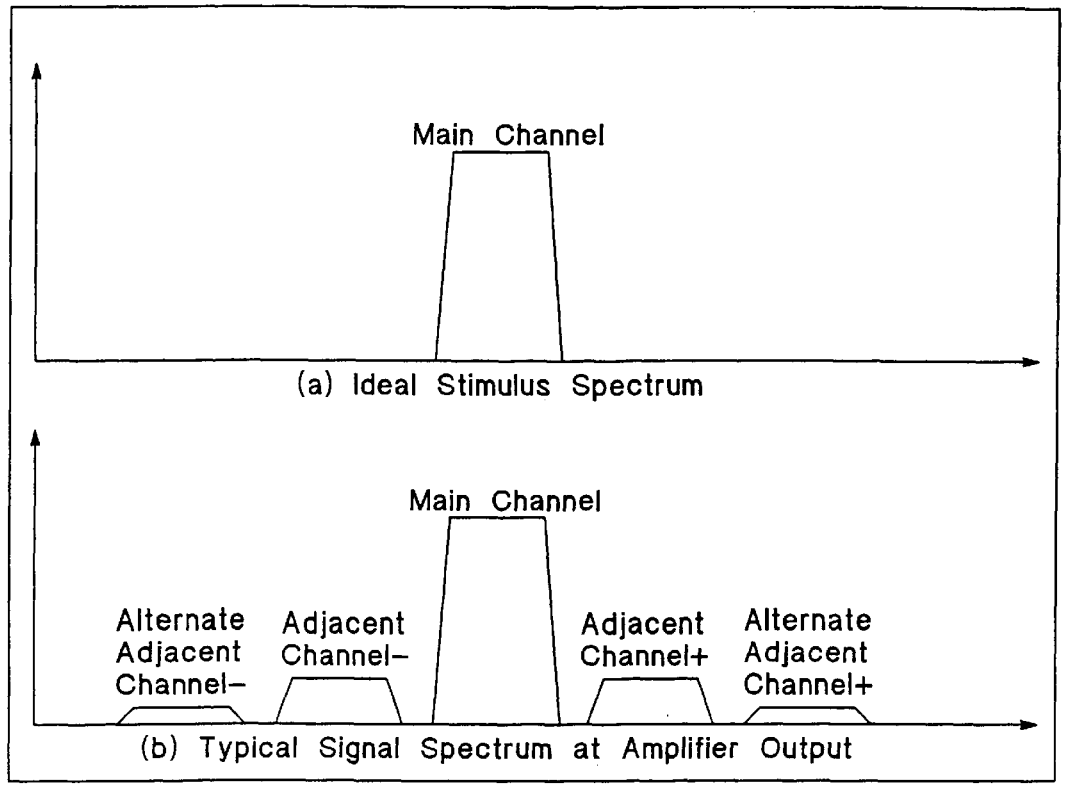
FIGS. 3a and 3b show signal spectrum patterns.

The Problem Under ideal measurement conditions, the input to the DUT 24 in FIG. 2 would have a spectrum that would contain spectral components only in the desired signal channel, as shown in FIG. 3(a). The DUT 24, however, typically has non-linearities that cause the desired spectral components of the signal to mix with each other and create spectral components at other frequencies. These extra signal components form a power spectrum in the adjacent channels, as shown in FIG. 3(b). This is the adjacent-channel power that must be measured. The ratio of the main-channel power to the power in the adjacent channel is the adjacent-channel power ratio. Another common term for such power is "spectral regrowth".

The difference in level that is required between the main-channel signal and the adjacent channel signal is becoming so large for many systems that it taxes the performance of signal sources and measuring instruments. Intermodulation distortion occurring in the active circuits of the signal source and the measuring instrument, similar to that generated in the DUT 24, results in additional adjacent-channel power that tends to mask the effect that needs to be measured for the DUT 24. Thus some of the adjacent-channel power shown in FIG. 3(b) could come from the signal source and then be legitimately amplified by the DUT. That amplified source power is not due to nonlinearities in the DUT 24, but it does contribute to the measurement result of adjacent-channel power for the generic measurement setup. The high overall power level that is incident on the measuring instrument, furthermore, typically drives its circuitry at such a high level that it can generate additional adjacent-channel power that is also measured. The result is that IMD that originates in the signal source and in the measuring instrument decreases the measurement accuracy and can even dominate the ACP measurement.

New Measurement Method

Figure 4:
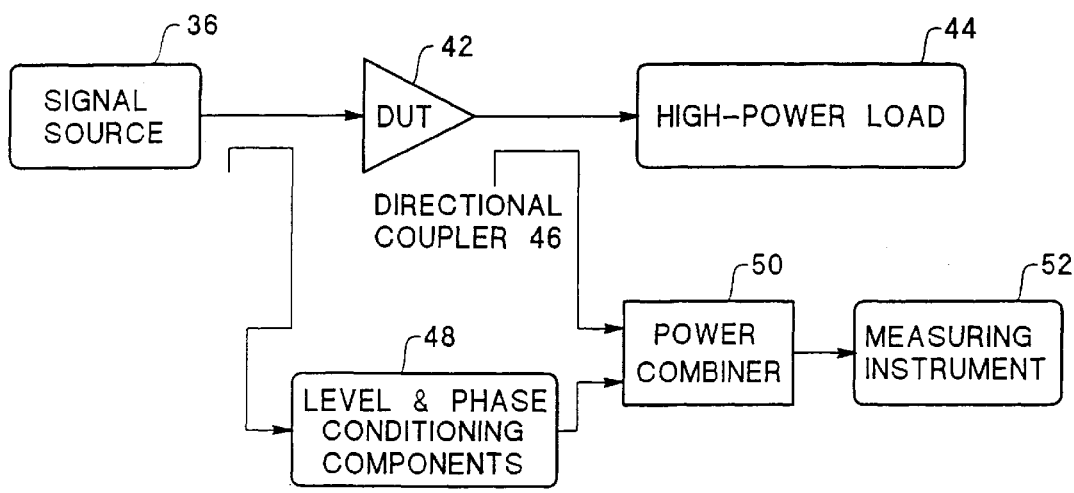
FIG. 4 shows a block diagram of the method of enhancing the dynamic range of intermodulation distortion measurements according to the present invention.

The present invention provides a measurement method that uses a cancellation signal during part of the process to remove unwanted components from the measurement. FIG. 4 shows the new measurement setup, which in one preferred embodiment includes two signal paths from the signal source 36 to the measuring instrument 52. The signals from the two paths are combined in the power combiner (or splitter) 50 just before the measuring instrument 52. The ratio measurement consists of two parts: the measurement of the total signal power out of the DUT 42, and the measurement of the DUT produced adjacent-channel power.

During the first part, the measurement of the signal power out of the DUT 42, the signal along the "level and phase conditioning" path (level & phase conditioning components 48) is removed or reduced to a very low level compared to the level coming from the DUT 42. Except for the presence of the power combiner 50, the setup is the same as the generic system of FIG. 2. This first part establishes the reference power for the ratio measurement. Power introduced into the adjacent channels by the signal source 36 and the measuring instrument 52 contributes to the measurement of the total signal power. These components, however, are usually small enough to be neglected during the first part of the measurement.

During the second part, which is the measurement of the DUT produced adjacent-channel power, a cancellation signal is applied along the lower path of FIG. 4. Cancellation occurs when the net gain along the two paths is equal in magnitude and time delay, but opposite in phase. The cancellation removes most of the stimulus spectrum from the measuring instrument 52. It also removes adjacent-channel power generated by the signal source by canceling the DUT amplified components with the components that progress along the lower path. The cancellation, however, has no effect on the distortion products caused by the DUT 42. Those components are still present at the measuring instrument 52. Note also, that the present invention, in removing a considerable amount of the stimulus spectrum from the output, reduces the power input to the measuring instrument and thereby reduces the distortion products caused by the measuring instrument.

Another advantage of this system is that it tends to improve two components of noise that could limit the measurement range for the adjacent-channel power, especially when measuring low-level amplifiers. The first component is noise produced by the signal source in the frequency range of measurement. That noise travels to the measuring instrument 52 along the two paths. When the two paths combine in the power combiner 50, they tend to cancel each other. The second component of noise improvement results from being able to operate the measuring instrument 52 with reduced or no attenuation at its input. When a spectrum analyzer, for example, is used as the measuring instrument, the generic setup usually requires the input attenuator to be set at 10, 20 or even 30 dB. This lowers the input signal level enough to prevent the spectrum analyzer from producing excessive distortion during the measurement of adjacent-channel power. That attenuator setting raises the noise figure of the spectrum analyzer and therefore limits the range of the generic measurement process. With the present invention, however, the signal level is already reduced by 25 dB or more through the cancellation process. That means the spectrum analyzer input attenuator can usually be set at 0 dB and the spectrum analyzer will have its minimum noise figure.

Measurement Results

Figure 5:
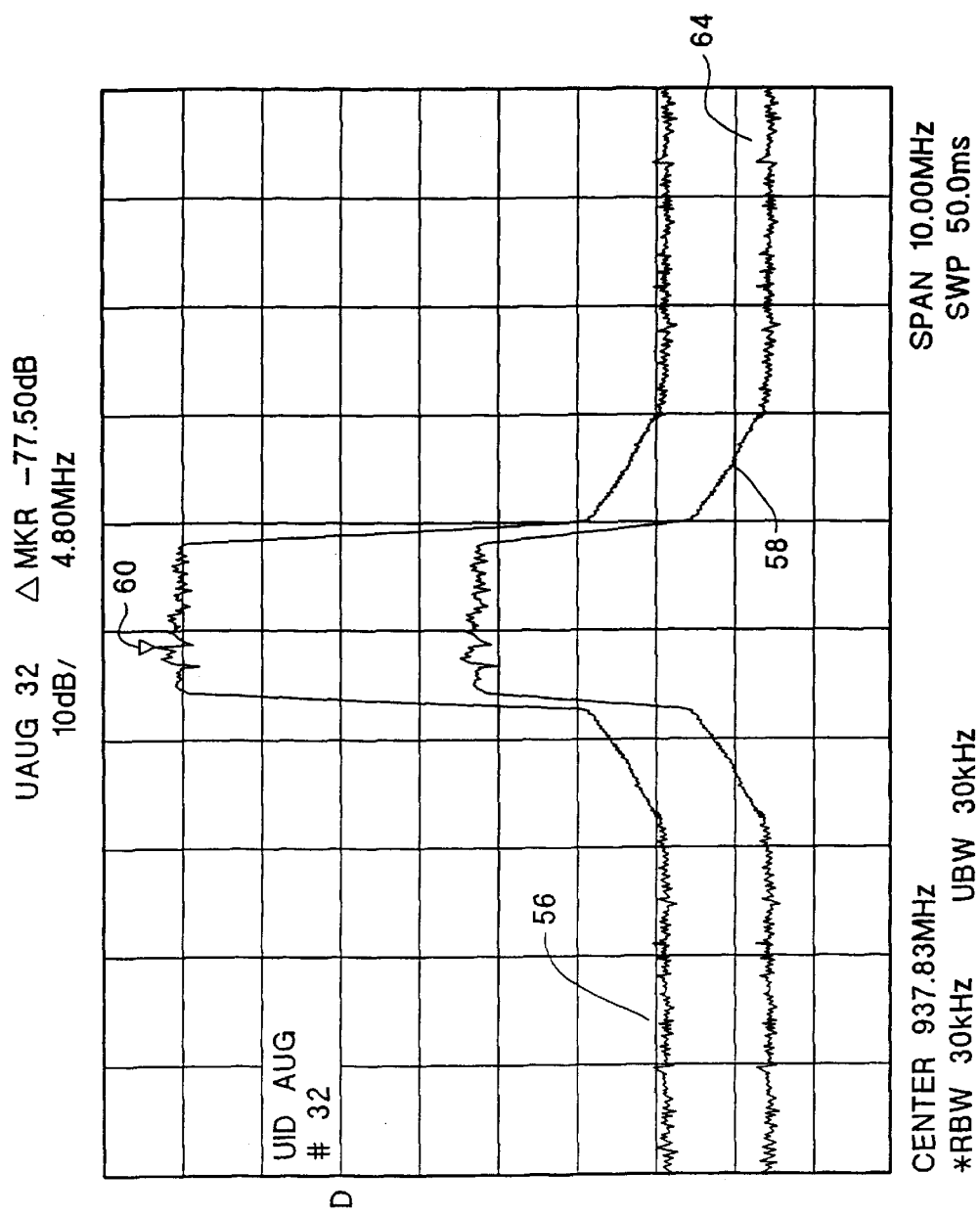
FIG. 5 shows measurement waveforms displayed on a spectrum analyzer before and after cancellation.

FIG. 5 shows the results of measuring a CDMA (IS-95) signal with 9 Walsh-code channels activated. The upper waveform 56 shows the main signal for the DUT path alone (without the cancellation path). The lower waveform 58 includes the cancellation path. The reference marker 60 is at the peak of the main signal. The ACP marker 64 is near the middle of the ninth division of the lower trace. Before the cancellation, the ACP marker 64, if it were on the upper trace 56, would only be about 61 dB below the reference marker. That would be the best result achievable for the generic method. Applying and adjusting the cancellation signal results in the lower trace. The main lobe of the signal shows about 35 dB of cancellation. The power in the adjacent channels caused by the measuring apparatus is also canceled. The ACP from the DUT, however, is not canceled. The ACP measurement marker is now 77.5 dB down from the reference marker. The measurement improved by about 16.5 dB because of the increased dynamic range of the measurement from using this cancellation technique.

Figure 6:
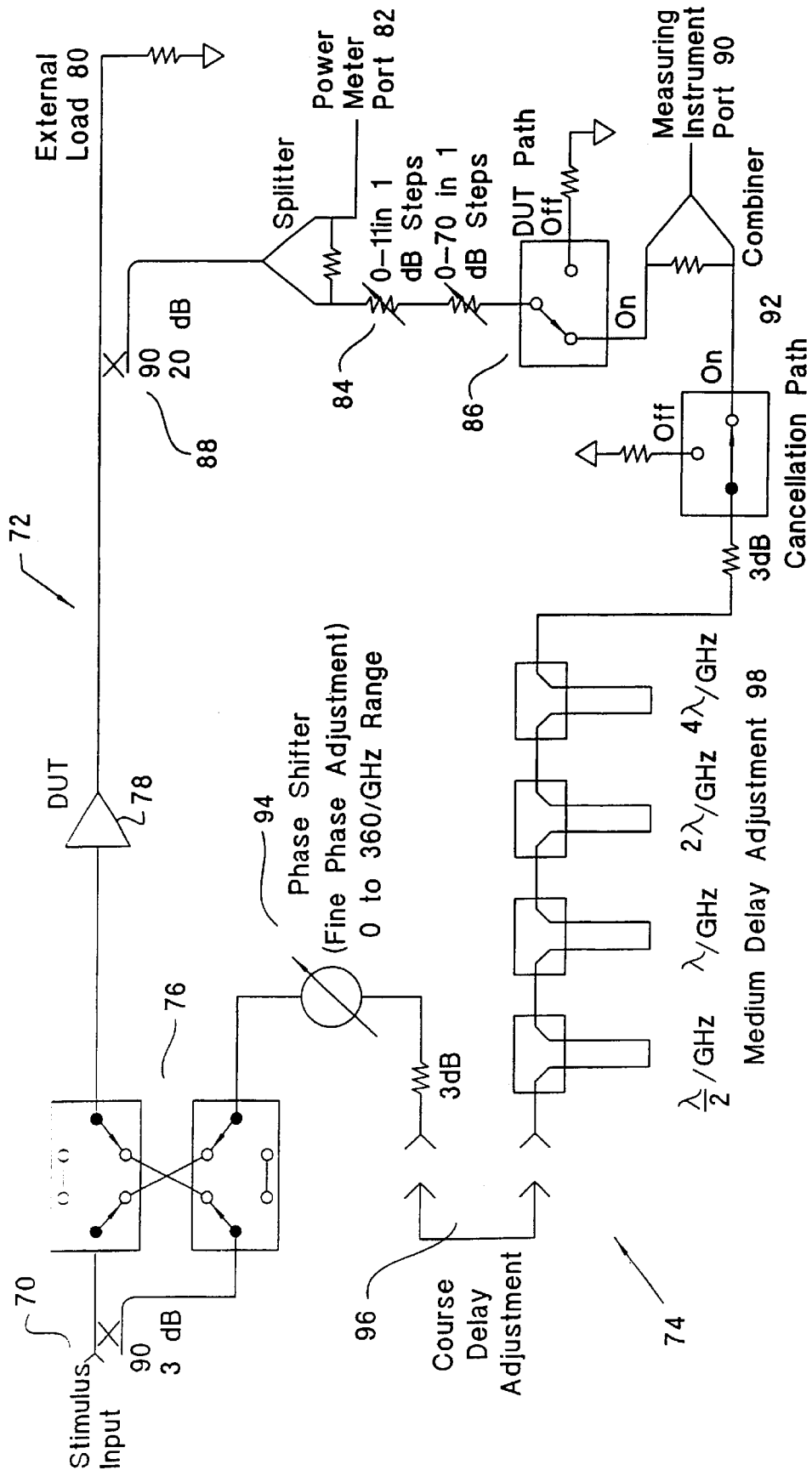
FIG. 6 shows an arrangement of level and phase conditioning components for convenient measurement of a broad range of devices.

FIG. 6 is the diagram of a measuring setup that uses the new technique. It applies to DUTs with 20 dB or more gain and power output up to 50 watts. The equipment, except for that shown as attached to external ports, fits in a box. Several aspects of FIG. 6 deserve special comment.

FIG. 6 includes hybrids and directional couplers. Because the auxiliary line of couplers and hybrids have 90° of phase shift compared to the main line, two such phase shifts in one path gives 180° of phase shift, which is usually needed for cancellation. Accomplishing the 180° offset that way instead of adding a λ/2 section of transmission line gives a broader bandwidth of cancellation. The input hybrid 70, which divides the input signal into a DUT path 72 and a cancellation path 74, has switches 76 at its output so that the auxiliary line may be placed in the either path. That allows the net phase shift differential along the two paths to be 0° or 180° with equal time delays in the two paths. In the case of a DUT with an odd number of class-A stages, the DUT introduces the 180° phase offset. Then 0° differential for the components of the two paths is more appropriate. That will yield the maximum bandwidth of cancellation. For an even number of Class-A stages, 180° differential is more appropriate. Although hybrids and directional couplers can give cancellation over the broadest band, using power splitters instead is satisfactory for many measurements where cancellation over the broadest band might not be so important.

The DUT path 72 of FIG. 6 includes a high-power external load 80 to suit the particular power output of the DUT 78, and a port 82 to connect a power meter for helping to adjust the power output from the DUT 78. The DUT path 72 also includes step attenuators 84 for adjusting the signal level entering the measuring instrument to be the same for the DUT path 72 as for the cancellation path 74. Note that the attenuators 84 are in the DUT path 72 instead of the cancellation path 74. This is a minor change from the basic block diagram of FIG. 4, but having them in the DUT path 72 is more convenient. The DUT path 72 also includes a switch 86 to connect and disconnect the DUT path 72 from the measuring instrument 90 and hence from the measuring instrument. This is useful during the measurement procedure. The directional coupler 88 at the output of the DUT 78 is nominally 20 dB. That reduces the power enough to use a conventional power meter and enough for the level-setting attenuators 84. The directional coupler 88 can handle 50 watts of mainline power.

The cancellation path 74 includes three means of adjusting for phase cancellation. Fine phase adjustment occurs by adjusting a trombone line stretcher 94. The line stretcher for this configuration has an adjustment range of 360° at 1 GHz. It has twice as much range at 2 GHz. Coarse adjustment of delay occurs by adding a section of transmission line 96 to external ports of the cancellation path 74 so the delay along the two paths is roughly the same. Feed-forward amplifiers could have, for example, 80 ns delay. To have cancellation over a reasonable range, like a cellular band, a similar delay must be added to the cancellation path of the measurement system. That requires roughly 16 meters of transmission line for approximate balance. Medium adjustment of delay occurs by switching various short sections of transmission line 98 into or out of the cancellation path 74.

For 1 dB adjustable attenuators the worst-case adjustment of the signal levels along the two paths can be within ±0.5 dB of each other. That results in cancellation of at least 25 dB. If the signals are closer in level, the cancellation will be greater. A half-dB-step attenuator allows the signals to be within ±0.25 dB of other. That allows cancellation of over 30 dB.

Figure 7A:
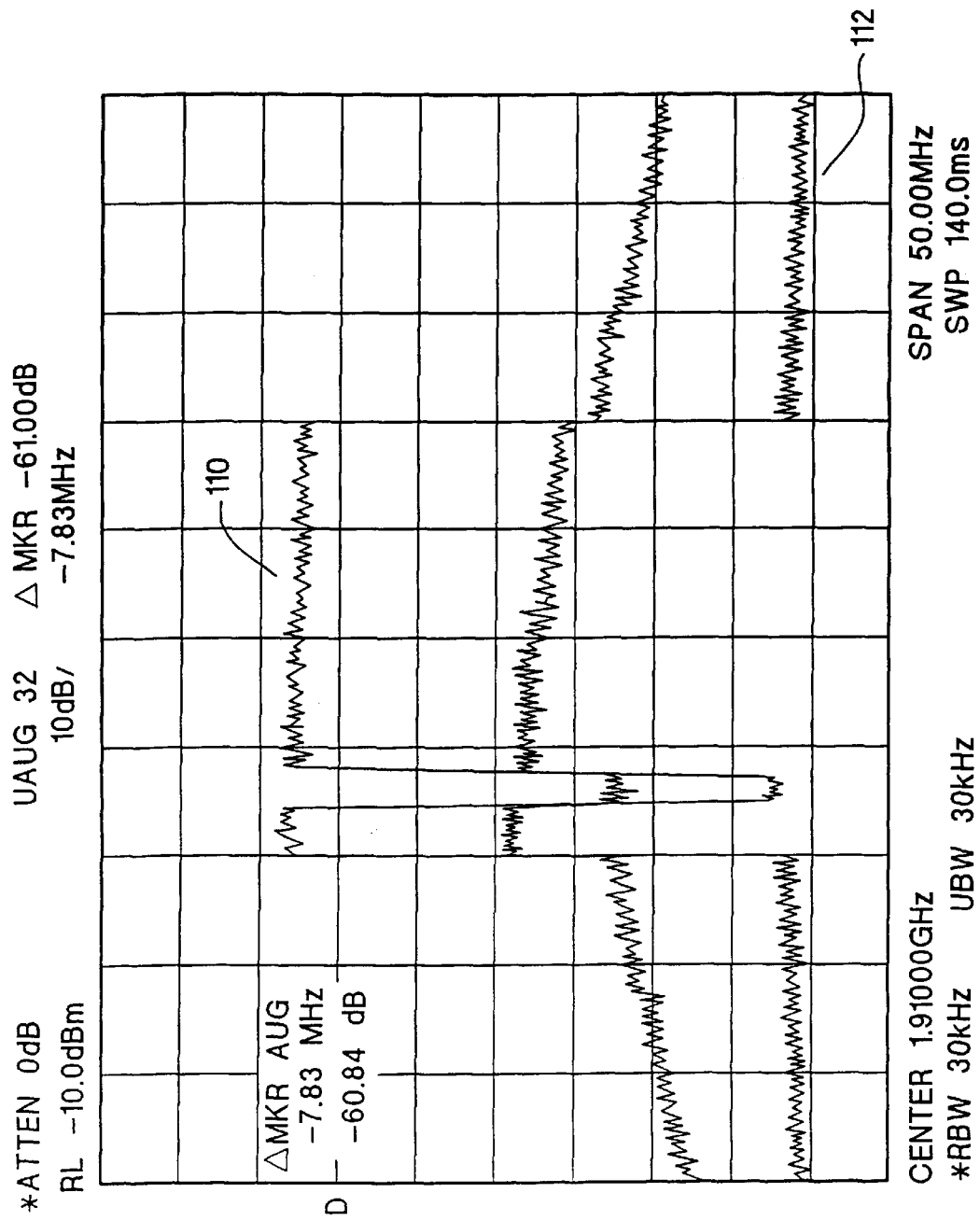
FIGS. 7a and 7b show measurement waveforms for Gaussian noise over a 20 MHz bandwidth.

FIG. 7 shows the effect of adjusting the two paths for 180° phase shift, but in one case of not having the same time delay. FIG. 7 illustrates IMD measurement using noise power ratio (NPR). The noise from the stimulus in this example is Gaussian and covers a 20 MHz bandwidth with a 1 MHz wide notch in the noise at a frequency 8 MHz below the center frequency. Intermodulation distortion tends to fill in the notch of the noise pattern with spectral regrowth. FIG. 7(a) shows the situation when the cancellation path is equal in time delay to that of the DUT path. The top waveform 10 of FIG. 7(a) shows what a generic IMD measurement would yield for the equipment used. Here the intermodulation includes contributions from the DUT, the stimulus, and the front end of the spectrum analyzer. The depth of the notch is only about 37 dB. The lower trace 112 of FIG. 7(a) shows the effect of cancellation when the delay of the cancellation path is the same as the DUT path and phase is 180° different. There the depth of the notch is 61 dB below the noise level out of the DUT. The IMD produced by the DUT is at least that low, not the 37 dB that would be measured, by the generic technique.

Figure 7B:
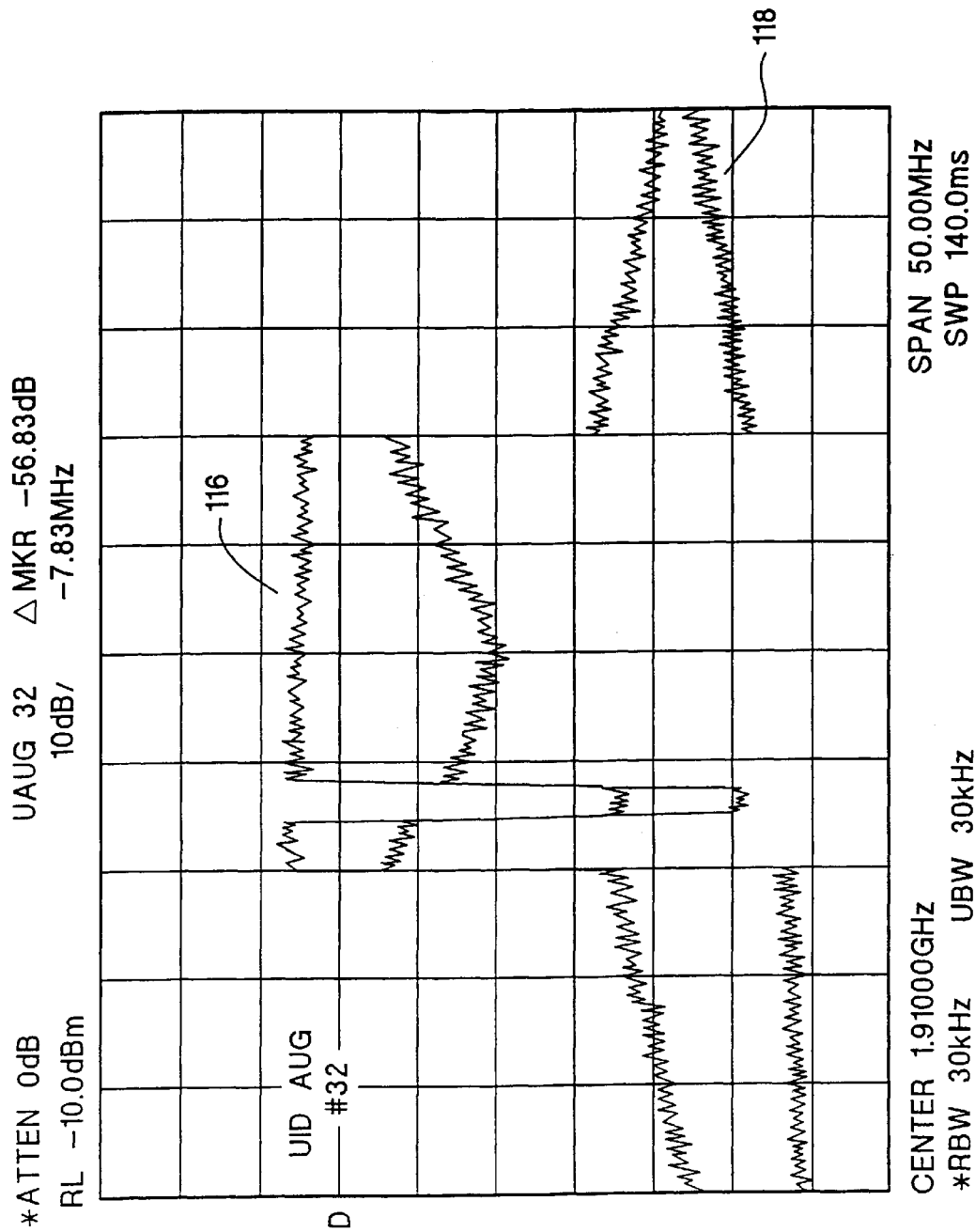

FIG. 7(b) shows the case when the time delay along the two paths is not the same. The cancellation path 118 for FIG. 7(b) has an additional 7.5λ of transmission line. The phase is still adjusted with the trombone line stretcher for 180° difference in the middle of the noise signal so there is cancellation at the center frequency. At other frequencies, however, the difference in length of the two paths results in different phase shifts. The cancellation is not as effective and the depth of the notch is only 57 dB. That is still a considerable improvement over the 37 dB of the generic method, but not as good as the 61 dB measured with the two paths having the same delay.

Improvements for Special Needs

Oftentimes high-power amplifiers require a higher level from the signal source than it can provide. That requires an additional amplifier at the stimulus output. For the generic technique that amplifier must be very free of distortion. For this technique, however, the IMD components from the additional amplifier are largely canceled for the final measurement. That means the amplifier does not need to be so distortion free.

When the DUT is a low-level amplifier, the IMD is often so low that the measurement is limited by the noise figure of the measuring instrument. For the present invention, however, a low-noise preamplifier may be used ahead of the measuring instrument. Such low-noise preamplifiers tend to introduce IMD into the measuring instrument. For this technique, however, the cancellation of the main signal power operates the preamplifier at a lower power level, enabling it to introduce less IMD into the measuring instrument.

Measurement Process

A procedure for making the measurement is:
1. Adjust the coarse delay 96 by attaching a length of transmission line whose delay roughly corresponds to that of the DUT.
2. Set the DUT path switch 86 to the ON position and the cancellation path switch 92 to OFF. Adjust the input power from the stimulus to give the required output power level from the DUT as measured on the power meter 82. (Offset the power meter reading for path loss between the DUT and the power meter port.)
3. Set the DUT 86 path to OFF and the cancellation path 92 to ON. Measure the signal strength of the cancellation path to the measuring instrument 90.
4. Set the DUT path 86 to ON and the cancellation path 92 to OFF. Adjust the attenuators 84 so the signal strength to the measuring instrument 90 corresponds to that of the previous step. This sets the amplitudes of the signals along the two paths to be close.
5. Set the DUT path 86 and the cancellation path 92 to the ON position. Adjust the phase shifter 94 for the minimum signal level at the measuring instrument 90. If the cancellation is not at least 25 dB, alternately adjust the attenuators 84 and the phase shifter 94 to reduce the signal level to the measuring instrument to give 25 dB or more cancellation to the main signal.
6. For the medium delay adjustment 98, remove or add sections of transmission line to make the cancellation valid over the frequency range needed. Repeat the previous step each time a section of transmission line is removed or added.
7. Set the cancellation path 92 to OFF and the DUT path 86 to ON. Measure the DUT signal level with the measuring instrument 90 to establish the reference for the ACPR measurement.
8. Set the cancellation path 92 and DUT path 86 to ON. Measure the ACP on the measuring instrument 90. Take the ratio of this result to the reference established in step 7 for ACPR. Some ACPR measurement standards require specific and different bandwidths for the measurement of steps 7 and 8. Make suitable adjustments to the measuring instrument to accommodate those standards.

The above description is very detailed. It therefore makes the procedure seem a bit complicated. But it is fairly simple and quick, especially after the system is set up for a specific type of DUT. After measuring the first DUT, device similarity usually means using only steps 2, 5, 7, and 8 in the above process. Steps 2, 7, and 8 are necessary for the generic process, so this procedure is usually only one additional step.

The present invention provides a cancellation technique that increases the range of intermodulation distortion measurement, including ACPR, by at least 25 dB over traditional IMD measurements. The cancellation signal removes most of the effect of IMD from the stimulus source in the distortion-measuring instrument. The cancellation signal also reduces the power level to the measuring instrument by the same amount so that it can operate with less attenuation at its input. That reduces the measuring instrument's effective noise figure and increases its dynamic range.

The present invention provides great improvement in the measurement range for CDMA ACPR and noise power ratio measurements. The technique according to the present invention also applies to other types of intermodulation distortion measurement. The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. For example, IMD measurements can include multi-tone techniques, ACP, ACPR and noise power ratio. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of enhancing the dynamic range of intermodulation distortion (IMD) measurements comprising the steps of:

applying a signal source over a first path to a device under test (DUT);

measuring with a measuring instrument through a power combiner the signal power out of the DUT to form a reference power, including measuring any spectral components of IMD power introduced by the DUT, the signal source and the measuring instrument;

applying a concellation signal over a second path through level and phase conditioning components and the power combiner to the measuring instrument to cancel the signal over the first path to remove the main channel power introduced from the DUT and the spectral components of IMD power introduced by the signal source amplified by the DUT, and;

measuring the DUT introduced spectral components of power to enhance the dynamic range measurement.

2. The method as in claim 1 wherein the spectral components of IMD power are adjacent-channel power components.

3. A method of enhancing the dynamic range of intermodulation distortion measurements comprising the steps of:

applying a signal source over a first path to a device under test (DUT);

measuring the signal power out of the DUT to form a reference power, including measuring any power introduced into adjacent channels by the DUT, the signal source and the measuring instrument;

applying a cancellation signal from the signal source over a second path that combines with the signal from the DUT or a sample of that signal to a measuring instrument to remove the main signal power from the DUT and distortion components introduced by the signal source, including those that are amplified by the DUT, and;

measuring the DUT introduced intermodulation distortion components to enhance the dynamic range of the measurement.

4. A method of enhancing the dynamic range of intermodulation distortion measurements comprising the steps of:

applying a signal source over a first path to a device under test (DUT);

measuring with a measuring instrument the total signal power out of the DUT to form a reference power, including measuring any power introduced into adjacent-channels by the DUT, the signal source and the measuring instrument;

applying a cancellation signal over a second path to the measuring instrument to cancel the signal over the first path to remove the main channel power introduced from the DUT and adjacent-channel power introduced by the signal source amplified by the DUT, and;

measuring the DUT introduced adjacent-channel power to enhance the dynamic range measurement.

5. The method as in claim 4 including the step of with the measuring instrument through a power combiner the total signal power out of the DUT to form the reference power.

6. The method as in claim 4 including the step of applying and adjusting the cancellation signal over the second path through level and phase conditioning components and the power combiner to the measuring instrument to cancel the signal over the first path to remove the main channel power introduced from the DUT and adjacent-channel power introduced by the signal source amplified by the DUT.

7. The method as in claim 6 wherein the enhanced range is at least 25 dB of cancellation.

* * * * *